(12) United States Patent
Kanzaki et al.

(10) Patent No.: US 8,885,127 B2
(45) Date of Patent: Nov. 11, 2014

(54) LIQUID CRYSTAL DISPLAY DEVICE AND METHOD FOR FABRICATING THE SAME

(75) Inventors: Yohsuke Kanzaki, Osaka (JP); Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 151 days.

(21) Appl. No.: 13/702,697

(22) PCT Filed: May 18, 2011

(86) PCT No.: PCT/JP2011/002771
§ 371 (c)(1),
(2), (4) Date: Dec. 7, 2012

(87) PCT Pub. No.: WO2011/155133
PCT Pub. Date: Dec. 15, 2011

(65) Prior Publication Data
US 2013/0077035 A1 Mar. 28, 2013

(30) Foreign Application Priority Data

Jun. 10, 2010 (JP) ................................. 2010-133325

(51) Int. Cl.
*G02F 1/1337* (2006.01)
*H01L 33/00* (2010.01)
*G02F 1/1345* (2006.01)
*G02F 1/1339* (2006.01)
*G02F 1/1333* (2006.01)

(52) U.S. Cl.
CPC ............ *G02F 1/1337* (2013.01); *H01L 33/005* (2013.01); *G02F 1/1345* (2013.01); *G02F 1/1339* (2013.01); *G02F 2201/133388* (2013.01); *G02F 1/133711* (2013.01); *G02F 2001/133302* (2013.01)
USPC ............................. 349/122; 349/123; 349/124

(58) Field of Classification Search
CPC ...................................................... G02F 1/1337
USPC .................................................. 349/123–124
See application file for complete search history.

(56) References Cited

U.S. PATENT DOCUMENTS

| 7,580,104 B2 | 8/2009 | Komeno et al. |
| 7,667,803 B2 * | 2/2010 | Kobayashi et al. ........... 349/122 |

(Continued)

FOREIGN PATENT DOCUMENTS

| EP | 2525251 A1 | 11/2012 |
| EP | 2525252 A1 | 11/2012 |

(Continued)

OTHER PUBLICATIONS

An International Search Report, dated Jul. 19, 2011, issued in International Application No. PCT/JP2011/002771.

*Primary Examiner* — James Dudek
(74) *Attorney, Agent, or Firm* — Lowe Hauptman & Ham, LLP

(57) ABSTRACT

A first substrate includes a wiring layer formed on a support substrate, and an insulating film covering the wiring layer on the support substrate and having a surface which is located opposite to the support substrate and partially and directly covered with an alignment film. As seen perpendicularly to (i.e. as seen in the direction of the normal to) a surface of the support substrate, a recess portion formed on the insulating film at least partially overlaps the wiring layer. A bank of the recess portion has such a shape that a tangent plane of the bank increases in inclination toward the support substrate as the tangent plane is shifted toward a bottom of the recess portion, and supports an edge end of the alignment film.

10 Claims, 12 Drawing Sheets

(56) References Cited

U.S. PATENT DOCUMENTS

| | | |
|---|---|---|
| 8,009,253 B2 | 8/2011 | Harada |
| 8,383,211 B2 * | 2/2013 | Kasuga et al. ................. 428/1.2 |
| 2007/0091247 A1 | 4/2007 | Onda |
| 2007/0279565 A1 | 12/2007 | Iwato et al. |
| 2008/0018848 A1 | 1/2008 | Iwato et al. |
| 2008/0062360 A1 | 3/2008 | Kobayashi et al. |
| 2011/0255041 A1 * | 10/2011 | Inoue ........................... 349/123 |

FOREIGN PATENT DOCUMENTS

| | | |
|---|---|---|
| JP | 2007034266 A | 2/2007 |
| JP | 2007-114586 A | 5/2007 |
| JP | 2007-322627 A | 12/2007 |
| JP | 2008-026345 A | 2/2008 |
| JP | 2008145461 A | 6/2008 |

* cited by examiner

15μm

15μm
62
43
42
41
16
21

51 48
43
42
41
16
21

LIQUID CRYSTAL DISPLAY DEVICE AND METHOD FOR FABRICATING THE SAME

RELATED APPLICATIONS

The present application is a National Stage of International Application No. PCT/JP2011/002771 filed May 18, 2011, and claims priority from, Japanese Application No. 2010-133325 filed Jun. 10, 2010.

TECHNICAL FIELD

The present disclosure relates to liquid crystal display devices and methods for fabricating the same, and more particularly, to control of a region to which an alignment film is applied.

BACKGROUND ART

Generally, a liquid crystal display device includes a pair of substrates and a liquid crystal layer enclosed between the substrates. The pair consists of a TFT substrate and a counter substrate. The TFT substrate includes, for example, a plurality of gate lines, a plurality of source lines, a plurality of pixel electrodes, and a plurality of TFTs formed thereon. On the counter substrate, a common electrode shared by the pixel electrodes is formed. The liquid crystal layer is enclosed between the TFT substrate and the counter substrate with a frame-shaped sealing material surrounding the liquid crystal layer.

A pixel region serving as a display region and a picture-frame region provided around the outer periphery of the pixel region and serving as a non-display region are formed on each of the substrates. The picture-frame region of the TFT substrate includes a sealing material formation region and a terminal region provided around the outer periphery of the sealing material formation region. The terminal region includes a plurality of terminals for supplying signals to the pixel region.

Each of the TFT and counter substrates includes an alignment film formed on a surface facing the liquid crystal layer and controlling orientation of liquid crystal molecules contained in the liquid crystal layer. The alignment film is made of a resin film such as a polyimide film, and has a surface subjected to a rubbing treatment.

Each alignment film is formed by applying liquid polyimide on a surface of the TFT substrate or a surface of the counter substrate, and then by curing the applied liquid polyimide by means of baking. The polyimide can be applied by using flexography or ink jet printing, for example.

When the ink jet printing is used to form the alignment film, an alignment film material, such as polyimide, needs to have a relatively low viscosity such that the alignment film material discharged toward and hitting on the substrate spreads sufficiently over the surface of the substrate.

Since the alignment film material with a low viscosity easily spreads on the surface of the substrate, it is likely that the material reaches the picture-frame region which should not include the alignment film. When the alignment film material reaches the terminal region of the picture-frame region, the terminals becomes covered with the resultant alignment film. Consequently, the alignment film which is an insulating film adversely interrupts continuity between the terminals and a circuit chip connected to the terminals.

Patent Documents 1 and 2 propose preventing an alignment film material from spreading excessively by forming a groove structure between a sealing material formation region of the TFT substrate and a pixel region for displaying images. The groove structure receives and stops the alignment film material.

For the purpose of reduction of spreading by wetting of an alignment film material, Patent Document 3 describes a structure in which a water-repellent region is provided on a surface of a TFT substrate, and a structure in which asperities made of the same material as used for forming a wiring layer on the TFT substrate are provided. Being made of the same material as that for the wiring layer, the asperities can be formed by etching at the same time as formation of the wiring layer.

FIG. 19 is a cross-sectional view showing the principle by which the structure described in Patent Document 3 controls spreading by wetting of the alignment film material. As shown in FIG. 19, the asperities 100 include a plurality of projections 102 arranged at predetermined intervals on a glass substrate 101. The projections 102 are made of the same metal film as used for the wiring layer. When a droplet 103 of the alignment film material is dropped on the asperities 100, the droplet 103 is likely to be repelled due to the presence of air layers 104 formed between the droplet 103 and the glass substrate 101. Accordingly, spreading by wetting of the droplet 103 can be controlled.

CITATION LIST

Patent Document

Patent Document 1: Japanese Patent Publication No. 2008-26345
Patent Document 2: Japanese Patent Publication No. 2007-322627
Patent Document 3: Japanese Patent Publication No. 2007-114586

SUMMARY OF THE INVENTION

Technical Problem

The structure as described in Patent Document 1 or 2, which includes a plurality of grooves to receive and stop an alignment film material, has disadvantages. Specifically, the area where the grooves are formed needs to have a relatively large width in order to ensure a capacity sufficient to receive and stop the alignment film material, and consequently, the pixel region is considerably spaced from the sealing material formation region. As a result, it is difficult to narrow the width of the non-display region in a frame shape.

In the invention described in Patent Document 3, the asperities cannot be formed in an area where the lines are present because formation of the asperities disadvantageously leads to a break of the lines. Thus, the area where the asperities can be formed is limited, and the alignment film material spreads by wetting toward the sealing material formation region in the area including no asperities. Consequently, the reliability of the liquid crystal display device may be significantly reduced.

It is therefore an object of the present disclosure to reduce spreading of the alignment film material, and at the same time, to narrow the non-display region of the liquid crystal display device as much as possible, regardless of the layout of the lines.

Solution to the Problem

To achieve the object, a liquid crystal display device of the present disclosure includes a first substrate, a second substrate provided opposite to the first substrate, a liquid crystal layer interposed between the first and second substrates, and a sealing material interposed between the first and second substrates and surrounding the liquid crystal layer to enclose the liquid crystal layer.

Each of the first and second substrates includes a pixel region serving as a display region and a picture-frame region serving as a non-display region surrounding an outer periphery of the pixel region and including a region where the sealing material is formed. On each of a surface of the first substrate facing the liquid crystal layer and a surface of the second substrate facing the liquid crystal layer, an alignment film formed by curing an alignment film material having fluidity spreads from the pixel region toward the picture-frame region. The first substrate includes a support substrate, a wiring layer formed on the support substrate, and an insulating film covering the wiring layer on the support substrate and having a surface located opposite to the support substrate and partially and directly covered with the alignment film. A recess portion which does not penetrate the insulating film is formed on a surface of the insulating film. As seen perpendicularly to a surface of the support substrate, the recess portion at least partially overlaps the wiring layer. A bank of the recess portion is located in the picture-frame region and has such a shape that a tangent plane of the bank increases in inclination toward the support substrate as the tangent plane is shifted toward a bottom of the recess portion. An edge end of the alignment film is supported by the bank of the recess portion whereas the bottom of the recess portion supporting the edge end of the alignment film is uncovered by the alignment film.

Function

Functions of the present disclosure will be described next.

When the liquid crystal display device is fabricated, the alignment film material before curing is allowed to spread from the pixel region toward the picture-frame region. The edge end of the alignment film is located in the picture-frame region. On the other hand, on the support substrate of the first substrate, the insulating film is formed to cover the wiring layer, and the recess portion is formed on the surface of the insulating film. The bank of the recess portion is located in the picture-frame region.

The bank of the recess portion holds back the alignment film material which spreads by wetting. Consequently, the edge end of the alignment film is supported by the bank of the recess portion. The bank of the recess, which has such a shape that the tangent plane of the bank increases in inclination toward the support substrate as the tangent plane is shifted toward a bottom of the recess portion, can support the alignment film material by means of the viscosity of the alignment film material.

Accordingly, the first substrate does not need to include, for example, a groove structure for receiving and stopping the alignment film material between the side of a support structure and a plurality of terminals. As a result, it is possible to narrow the non-display region of the liquid crystal display device to about 1-2 mm, for example, and at the same time, to reduce spreading of the alignment film material.

In addition, the structure in which the recess portion overlaps the wiring layer with the insulating film interposed between recess portion and the wiring layer enables the insulating film to protect the wiring layer, and at the same time, enables the recess portion to be formed to extend continuously regardless of the layout of the wiring layer. Accordingly, spreading of the alignment film material can be reduced more appropriately.

Meanwhile, the conventional structure in which a groove structure formed on a substrate receives and stops the alignment film material has disadvantages. Specifically, when fabricating a liquid crystal display device by dropping a liquid crystal material on the substrate, it is difficult to determine an appropriate volume of the liquid crystal material to be dropped, taking into account an unoccupied space of the capacity of the groove structure. This is because it cannot be known how much of the capacity of the groove structure is occupied by the alignment film material. If an insufficient amount of the liquid crystal material is used, the resultant liquid crystal layer may adversely contain air bubbles.

On the other hand, in the present disclosure, the alignment film material is not received in the recess portion, but is held back by the bank of the recess portion. Accordingly, the volume of the liquid crystal material to be dropped can be kept substantially constant. Therefore, an appropriate volume of the liquid crystal material can be supplied onto the surface of the support substrate, thereby reducing formation of air bubbles in the liquid crystal layer.

Advantages of the Invention

According to the present disclosure, it is unnecessary to provide the groove structure to receive and stop a resin material for the alignment film. Accordingly, the non-display region of the liquid crystal display device can be significantly narrowed, and at the same time, spreading of the alignment film material can be reduced. Further, the structure in which the recess portion overlaps the wiring layer with the insulating film interposed between the recess portion and the wiring layer enables the insulating film to protect the wiring layer, and at the same time, enables the recess portion to be formed to extend continuously regardless of the layout of the wiring layer. Accordingly, spreading of the alignment film material can be reduced more appropriately.

DESCRIPTION OF EMBODIMENTS

Embodiments of the present disclosure will be described in detail with reference to the drawings. Note that the present disclosure is not limited to the embodiments described below.

First Embodiment

FIGS. 1-10 show a first embodiment of the present disclosure.

Figure 1:
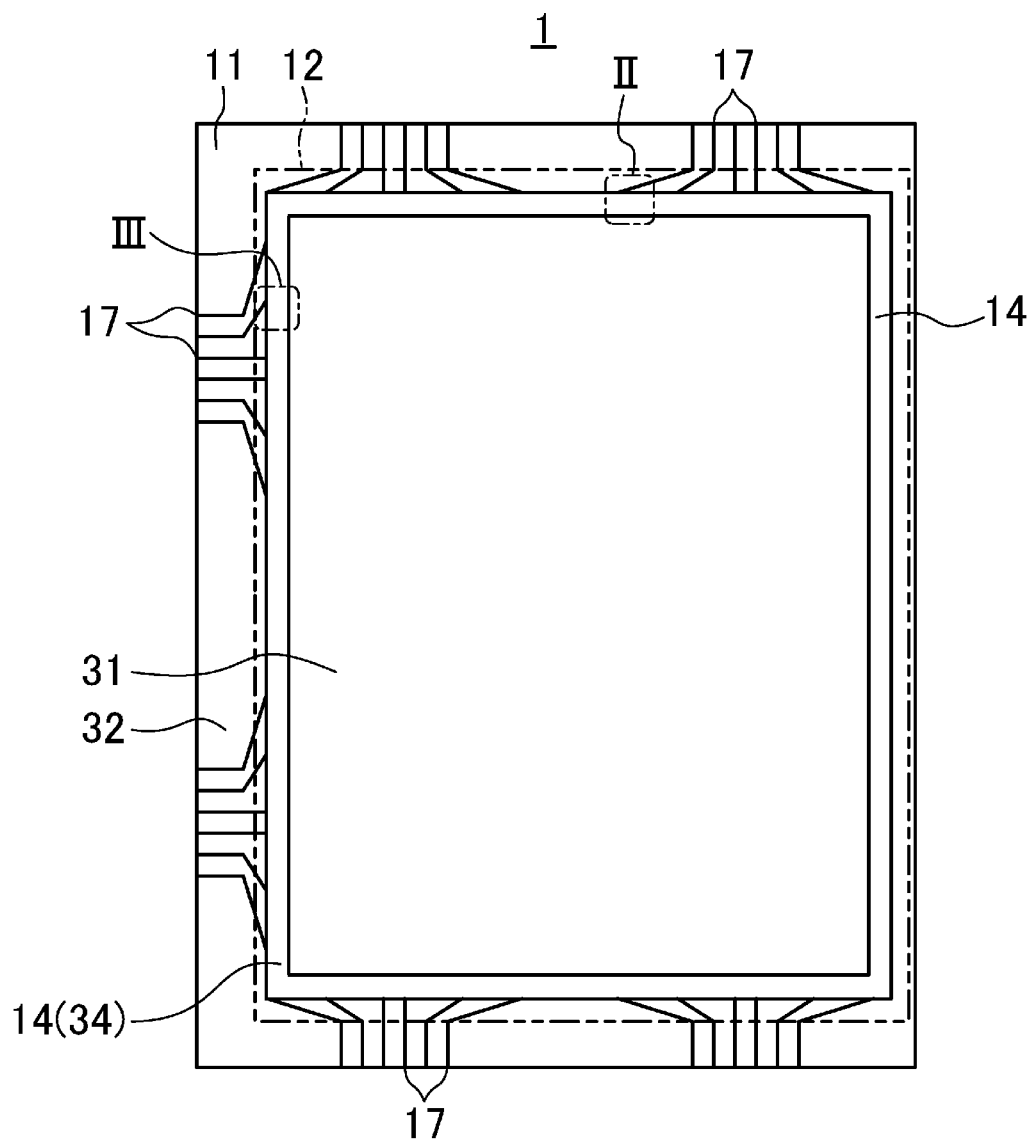
FIG. 1 is a plan view schematically showing a structure of a liquid crystal display device according to a first embodiment of the present disclosure.
Figure 2:
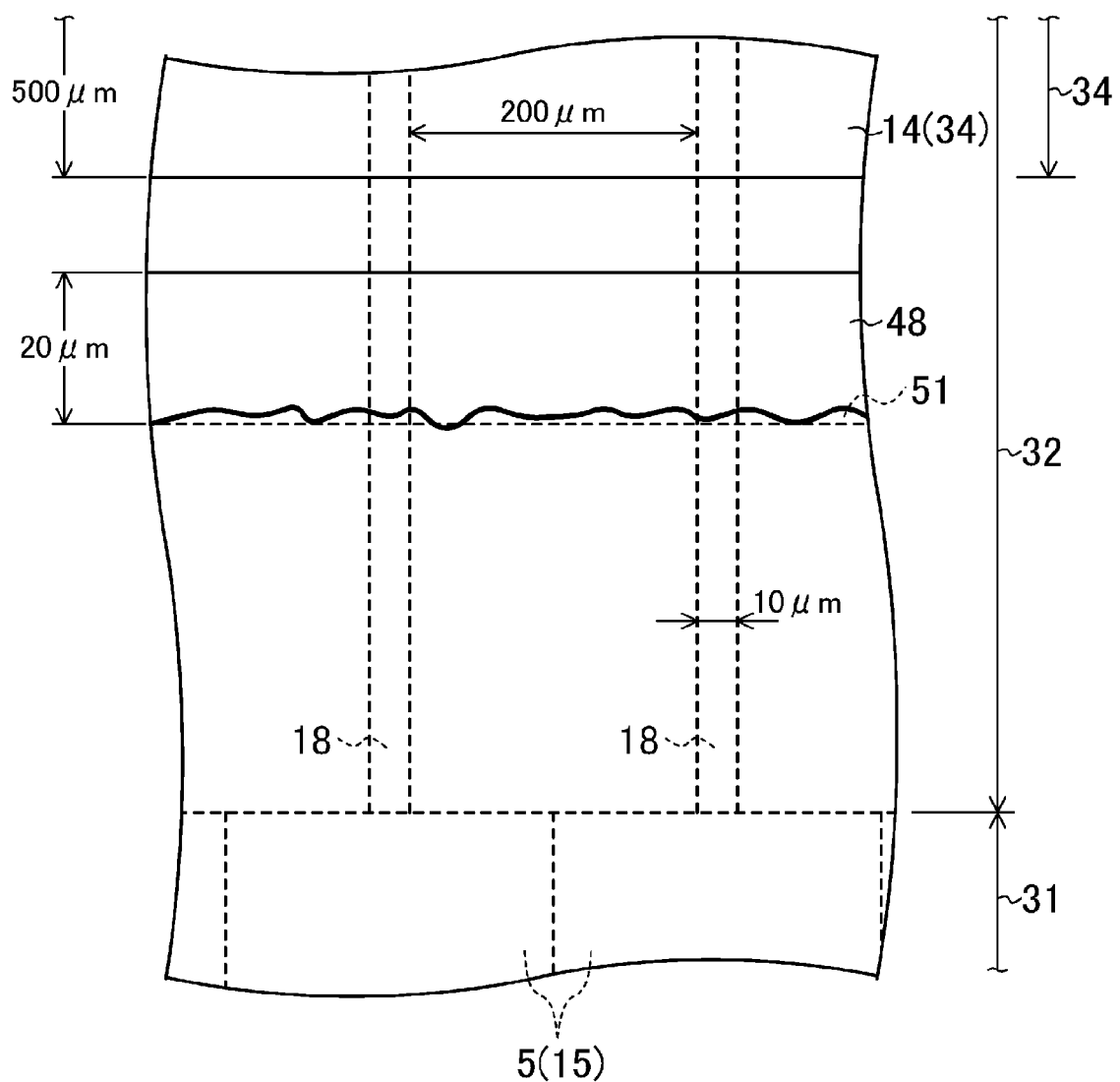
FIG. 2 is an enlarged plan view showing a section located on a TFT substrate 11 shown in FIG. 1 and indicated by reference character II.
Figure 3:
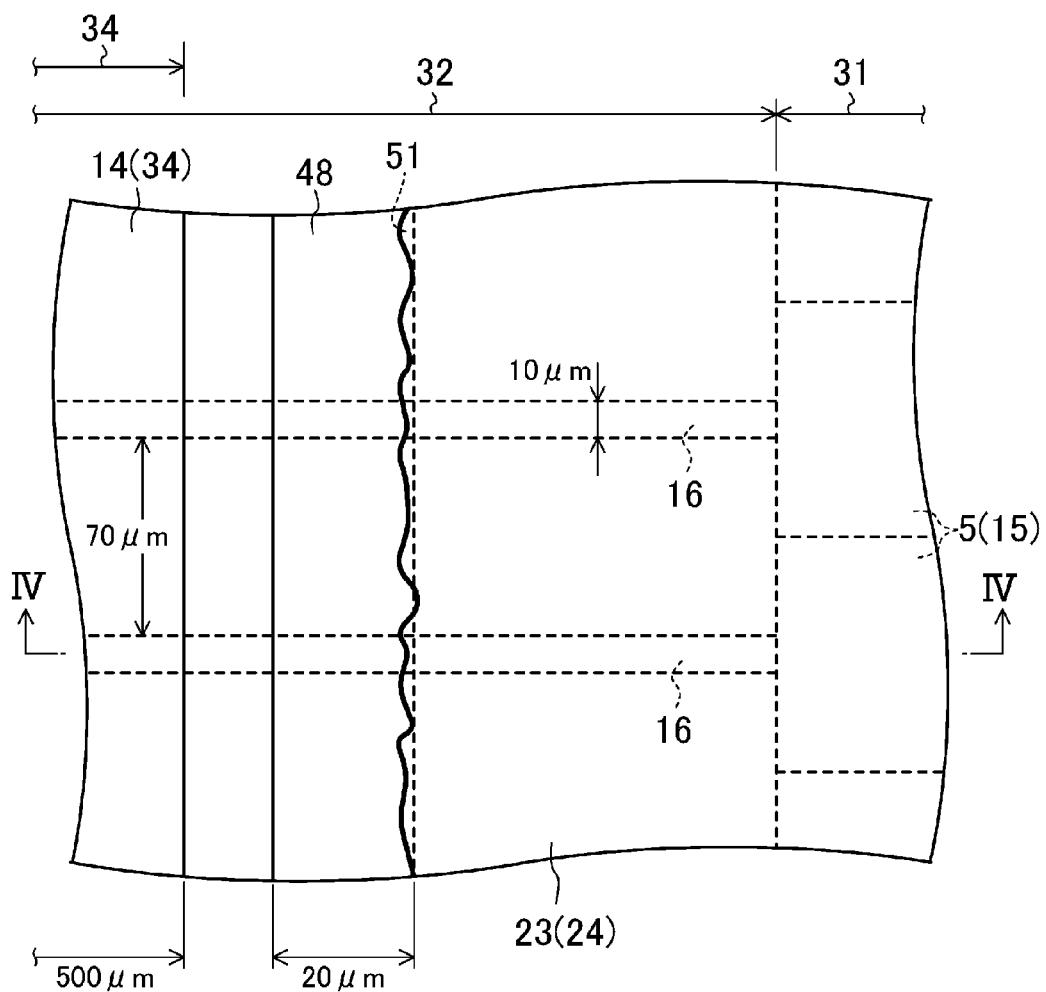
FIG. 3 is an enlarged plan view showing a section located on the TFT substrate 11 shown in FIG. 1 and indicated by reference character III.
Figure 4:
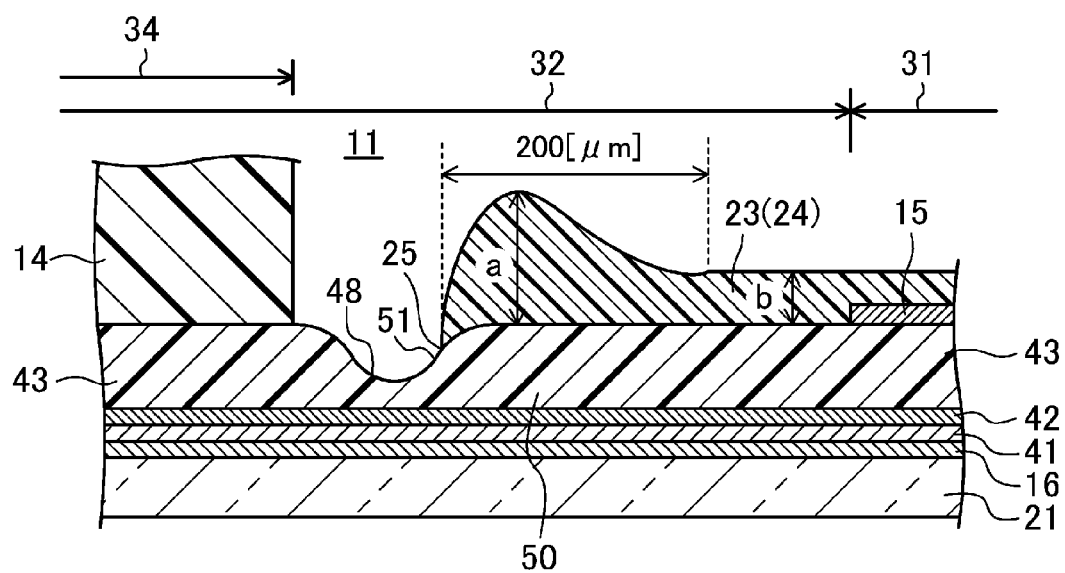
FIG. 4 is a cross-sectional view taken along the line IV-IV in FIG. 3.

FIG. 1 is a plan view schematically showing a structure of a liquid crystal display device 1 according to the first embodiment of the present disclosure. FIG. 2 is an enlarged plan view showing a section located on a TFT substrate 11 shown in FIG. 1 and indicated by reference character II. FIG. 3 is an enlarged plan view showing a section located on the TFT substrate 11 shown in FIG. 1 and indicated by reference character III. FIG. 4 is a cross-sectional view taken along the line IV-IV in FIG. 3.

Figure 5:
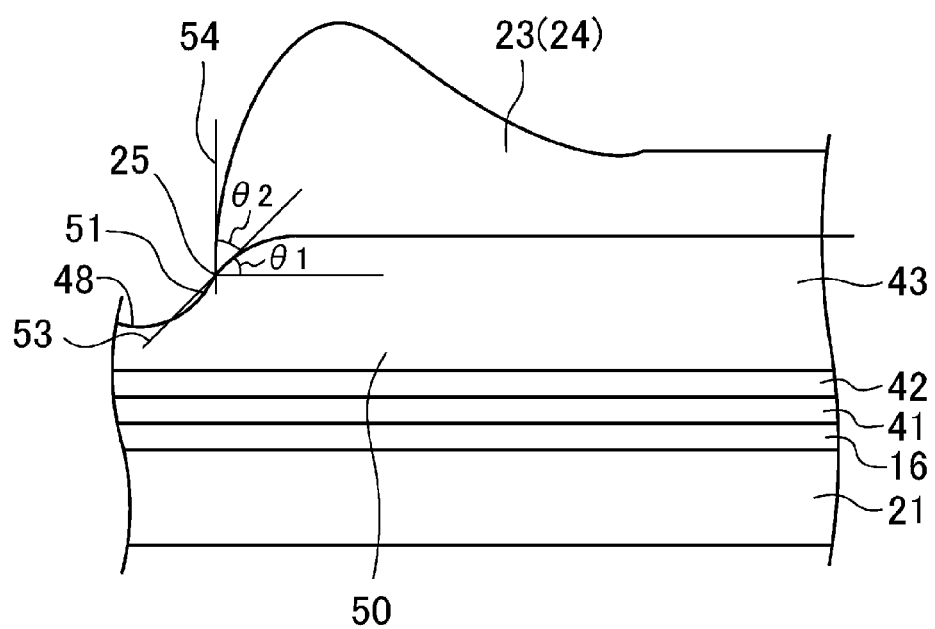
FIG. 5 is an enlarged cross-sectional view showing the vicinity of a bank of a recess portion located in the TFT substrate.
Figure 6:
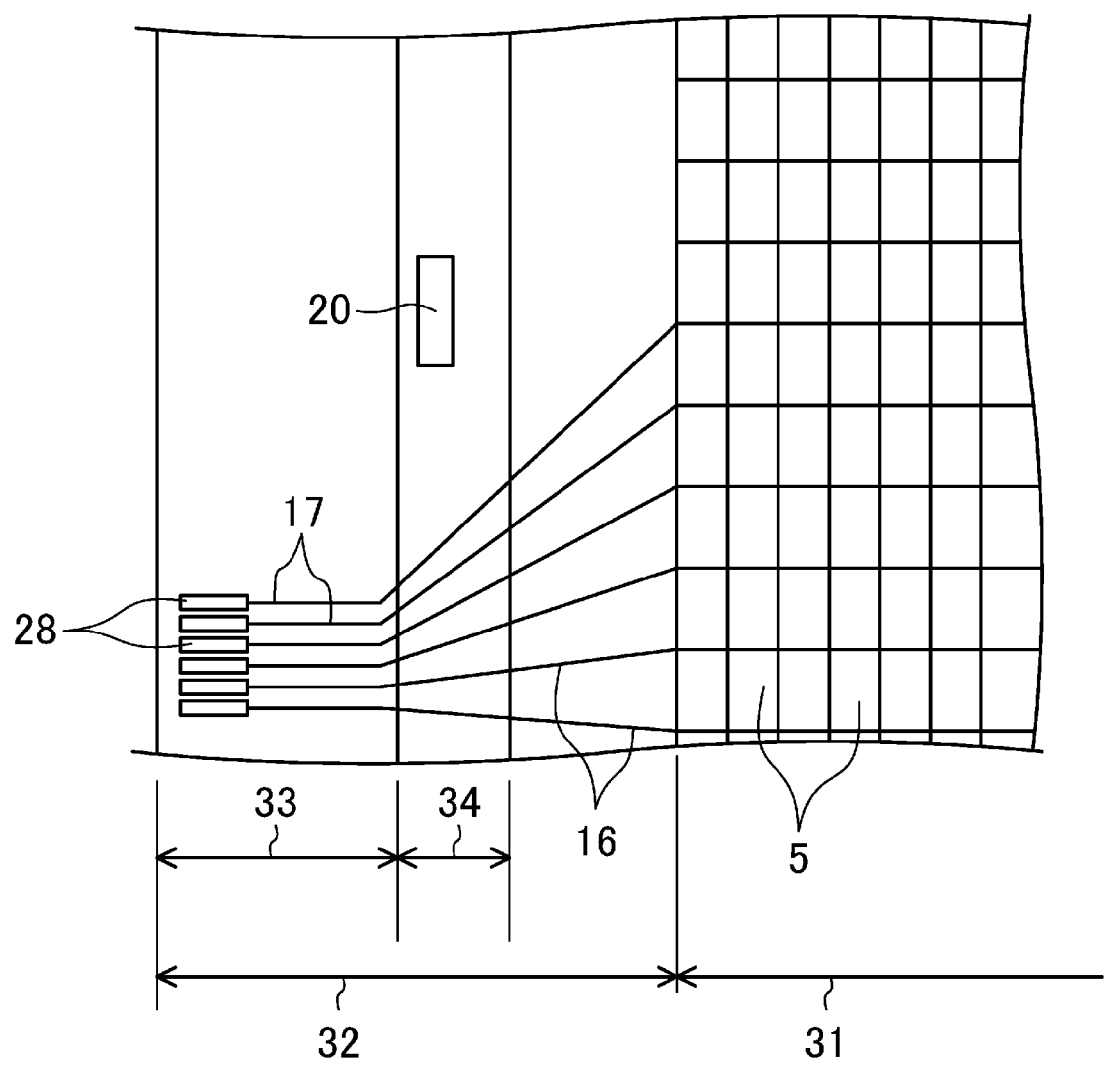
FIG. 6 is an enlarged plan view showing a portion of the TFT substrate.
Figure 10:
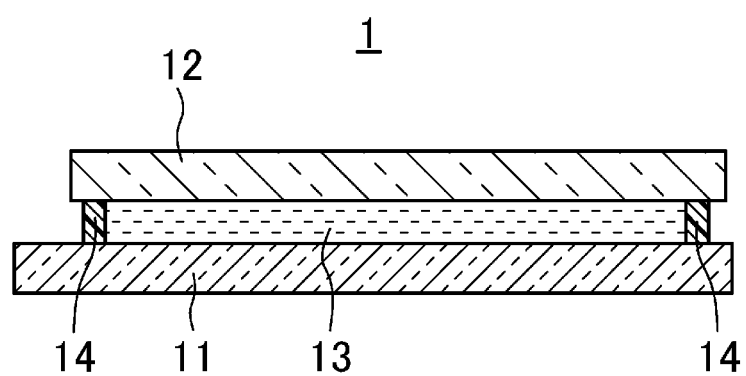
FIG. 10 is a cross-sectional view schematically showing the structure of the liquid crystal display device.

FIG. 5 is an enlarged cross-sectional view showing the vicinity of a bank 51 of a recess portion 48 located in the TFT substrate 11. FIG. 6 is an enlarged plan view showing a portion of the TFT substrate 11. In FIG. 6, an alignment film 23 which will be described later and the recess portion 48 are not shown. FIG. 10 is a cross-sectional view schematically showing the structure of the liquid crystal display device 1.

As shown in FIGS. 1 and 10, the liquid crystal display device 1 includes the TFT substrate 11 as a first substrate, a counter substrate 12 as a second substrate provided opposite to the TFT substrate 11, and a liquid crystal layer 13 interposed between the TFT substrate 11 and the counter substrate 12.

The liquid crystal display device 1 further includes a sealing material 14 provided between the TFT substrate 11 and the counter substrate 12 and surrounding the liquid crystal layer 13 to enclose the liquid crystal layer 13. As shown in FIG. 1, the sealing material 14 is formed in a substantially rectangular frame shape and composed of an UV-curable and thermosetting resin such as an acrylic resin or an epoxy resin. The sealing material 14 contains, for example, conductive particles (not shown) dispersed therein. The sealing material 14 has a line width of, for example, about 0.5-2.5 mm.

The TFT substrate 11 and the counter substrate 12 each include a pixel region 31 serving as a display region and a picture-frame region 32 provided around the outer periphery of the pixel region 31 and serving as a non-display region. The picture-frame region 32 includes a sealing material formation region 34 (a region where the sealing material 14 is formed), and a predetermined spacing is allowed between the sealing material formation region 34 and the spaced from the pixel region 31.

On each of a surface of the TFT substrate 11 facing the liquid crystal layer 13 and a surface of the counter substrate 12 facing the liquid crystal layer 13, an alignment film 23 which is made by curing an alignment film material 24 having fluidity spreads from the pixel region 31 toward the region where the sealing material 14 is formed.

The alignment film 23 is made of a resin material such as polyimide and controls an initial orientation of liquid crystal molecules contained in the liquid crystal layer 13. The alignment film material 24 is prepared by adding a solvent to, for example, polyimide to decrease the viscosity. For example, an alignment film material produced by JSR Corporation and having a viscosity of 6.5 mPa·s can be used as the alignment film material 24.

As shown in FIG. 6, the picture-frame region 32 of the TFT substrate 11 includes a terminal region 33 located at a side of the sealing material formation region 34 opposite to the pixel region 31. A plurality of terminals 28 for supplying signals to the pixel region 31 are formed in the terminal region 33. As shown in FIG. 6, the terminal region 33 is formed in a side area of the TFT substrate 11.

As shown in FIG. 6, in the sealing material formation region 34 of the TFT substrate 11, a plurality of pads 20 made of a transparent conductive film such as an indium tin oxide (ITO) film and serving as electrode portions are formed on a surface of a planarized film 43 serving as an insulating film. The pads 20 each having a thickness of about 100 nm are arranged at predetermined intervals along the sealing material 14. The pads 20 are to be electrically connected to the common electrode (not shown) of the counter electrode 12 through the conductive particles contained in the sealing material 14.

The pixel region 31 of the TFT substrate 11 includes a plurality of pixels 5 arranged in a matrix thereon. A pixel electrode 15 made of a transparent conductive film such as an ITO film is formed in each of the pixels 5. Each pixel electrode 15 has a thickness of about 100 nm. A thin-film transistor (a TFT, not shown) connected to the pixel electrode 15 and serving as a switching device is also formed in each of the pixels 5.

A semiconductor layer (not shown) constituting the TFTs has a structure in which an intrinsic silicon film (an i-Si film) having a thickness of 150 nm and an n+Si film having a thickness of 40 nm are laminated in this order. A SiNx film serving a channel protection film and having a thickness of about 200 nm is laminated on the semiconductor layer.

Further, as shown in FIGS. 2 and 3, gate lines 18 and source lines 16 which are connected to the TFTs are formed on the TFT substrate 11. The gate lines 18 have a structure in which a Ti film having a thickness of about 30 nm, an Al film having a thickness of about 300 nm, and a Ti film having a thickness of about 100 nm are laminated in this order. On the other hand, the source lines 16 have a structure in which a Ti film having a thickness of about 30 nm and an Al film having a thickness of about 300 nm are laminated in this order.

Each of the gate lines 18 and the source lines 16 has a line width of about 10 µm. As shown FIG. 2, the interval between adjacent ones of the gate lines 18 is about 200 µm. On the other hand, the interval between adjacent ones of the source lines 16 is about 70 µm, as shown in FIG. 3.

As shown in FIG. 4, the TFT substrate 11 further includes a glass substrate 21 serving as a support substrate. The gate lines 18 and a gate insulating film 41 covering the gate lines 18 are formed on a surface of the glass substrate 21 facing the liquid crystal layer 13. As shown in FIG. 1, a plurality of lead lines 17 made of the same material as that for the gate lines 18 are formed in the picture-frame region 32 of the glass substrate 21. The lead lines 17 each have a line width of about 10 μm. The terminals 28 are provided at ends of the lead lines 17.

The source lines 16 are connected to the lead lines 17 through contact portions (not shown). The gate insulating film 41 is made of, for example, SiNx and has a thickness of about 400 μm.

A passivation film 42 serving as a protective film is formed on a surface of the gate insulating film 41. The passivation film 42 is made of, for example, an inorganic film such as a SiN film, and has a thickness of about 250 nm.

The passivation film 42 and the planarized film 43 which is an insulting film covering the passivation film 42 are formed on the surfaces of the source lines 16. Thus, the planarized film 43 is formed on the glass substrate 21 and covers the wiring layer such as the source lines 16. The planarized film 43 is made of, for example, a photo-curable resin (a photo-sensitive resin) such as a photo-curable acrylic resin, and has a thickness of about 2-2.5 μm.

The pixel electrodes 15 are formed on a surface of a portion of the planarized film 43 located in the pixel region 31. On the other hand, the sealing material 14 is formed on the surface of a portion of the planarized film 43 located in the sealing material formation region 34. A portion of the surface of the planarized film 43 opposite to the glass substrate 21 is covered partially and directly with the alignment film 23.

The recess portion 48 is formed on a surface of the planarized film 43. The recess portion 48 does not penetrate the planarized film 43.

As seen perpendicularly to (i.e. as seen in the direction of the normal to) the surface of the glass substrate 21, the recess portion 48 at least partially overlaps the wiring layer such as the source lines 16 and the gate lines 18. As shown in FIGS. 2 and 3, the recess portion 48 of this embodiment extends along the sealing material formation region 34. The recess portion 48, which is a groove extending along the sealing material formation region, has a frame shape as a whole.

The recess portion 48 has, for example, a width of about 20 μm and a depth of about 1 μm. As will be described later, the recess portion 48 is formed by means of photolithography.

The bank 51 of the recess portion 48 is located in the picture-frame region 32, and particularly, between the pixel region 31 and the sealing material formation region 34. As shown in FIG. 5, the bank 51 of the recess portion 48 has such a shape that a tangent plane 53 of the bank 51 increases in inclination toward the glass substrate 21 as the tangent plane 53 is shifted toward the bottom of the recess portion 48. An edge end 25 of the alignment film 23 is supported by the bank 51 of the recess portion 48, and the bottom of the recess portion 48 supporting the edge end 25 of the alignment film 23 is uncovered by the alignment film 23.

Here, a maximum angle formed by the tangent plane 53 of the bank 51 of the recess portion 48 with the surface of the glass substrate 21 is referred to as θ1max. An angle formed by the tangent plane 53 at a point where the recess portion 48 supports the edge end 25 of the alignment film 23 (the alignment film material 24) with the surface of the glass substrate 21 is referred to as θ1. An angle formed by a tangent plane 54 at the surface of the edge end 25 of the alignment film 23 with the tangent plane 53 is referred to as θ2.

The bank 51 of the recess portion 48 is formed such that the maximum angle θ1max that the tangent plane 53 forms with the surface of the glass substrate 21 will be equal to or larger than 5°. On the other hand, the maximum angle θ1max is preferably smaller than 88°.

Figure 11:
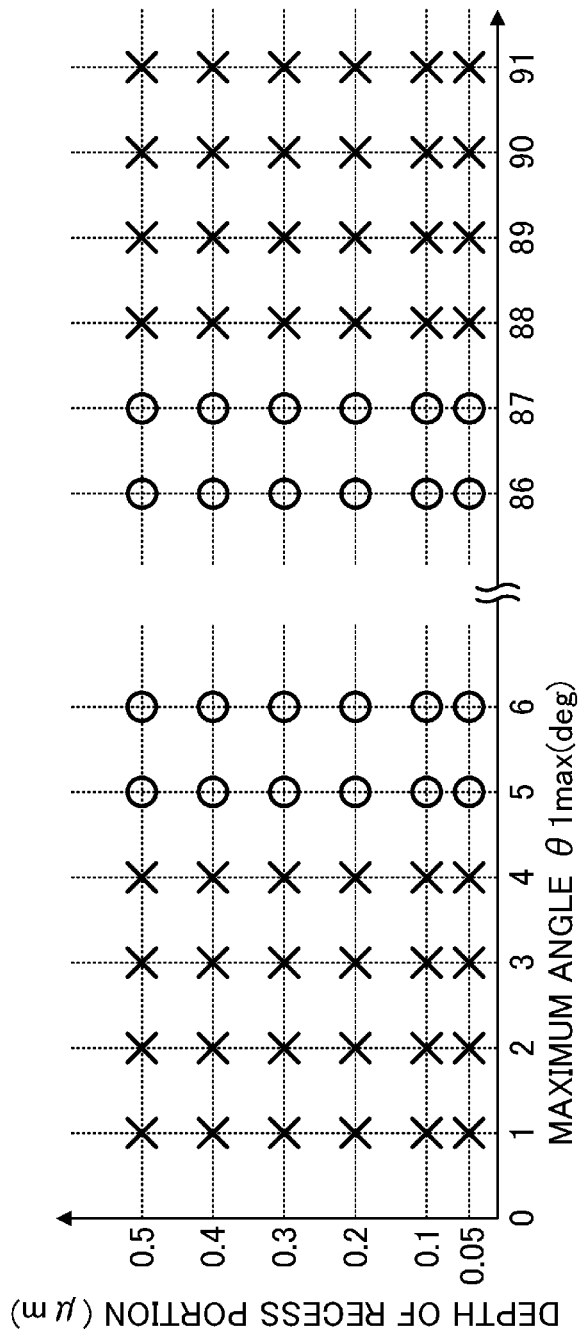
FIG. 11 is a graph showing a relation between a maximum angle at the bank, a depth of the concavity of the recess portion, and controllability of spreading of the alignment film material.

FIG. 11 is a graph showing a relation between the maximum angle θ1max at the bank 51, a depth of the recess portion 48, and controllability of spreading of the alignment film material 24. In FIG. 11, the circles represent points where the bank 51 appropriately supported the alignment film material 24, and the crosses represent points where the bank 51 did not support the alignment film material 24 appropriately. The alignment film material used for this experiment had a viscosity of 6.5 mPa·s.

Figure 12:
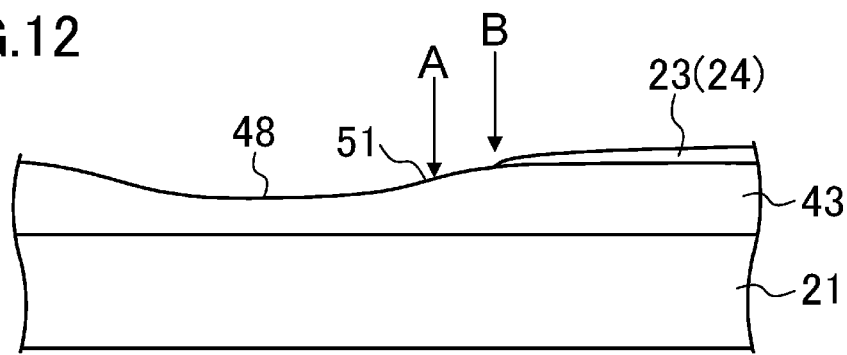
FIG. 12 is an enlarged cross-sectional view showing a state of the vicinity of the recess portion with θ1 max set approximately to 15°.
Figure 13:
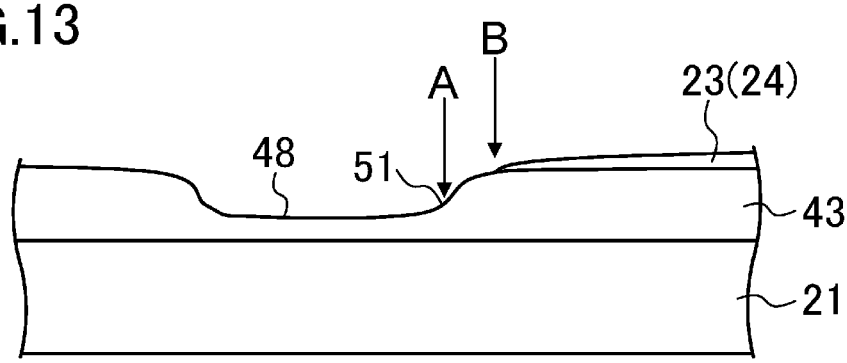
FIG. 13 is an enlarged cross-sectional view showing a state of the vicinity of the recess portion with θ1 max set approximately to 50°.
Figure 14:
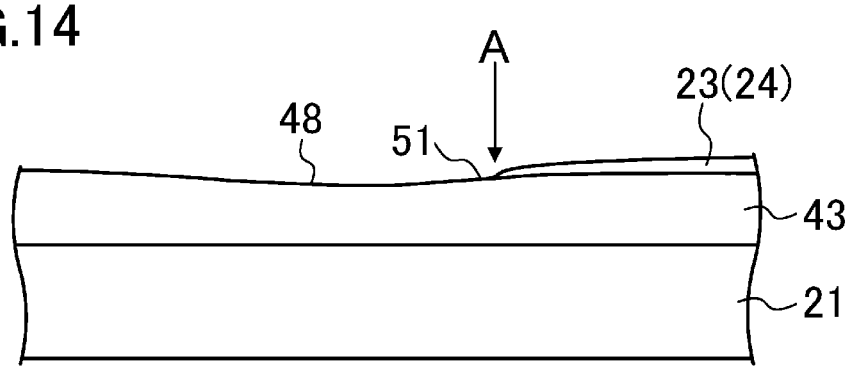
FIG. 14 is an enlarged cross-sectional view showing a state of the vicinity of the recess portion with θ1 max set approximately to 5°.

FIGS. 12-14 are enlarged cross-sectional views respectively showing states of the vicinity of the recess portion 48 with θ1max set approximately to 15°, 50° and 5°. In Each of FIGS. 12-14, reference character A indicates a point where the angle θ1 formed by the tangent plane 53 of the recess portion 48 is maximized, i.e., the maximum angle θ1max is formed. Reference character B indicates a point where the edge end 25 of the alignment film 23 (the alignment film material 24) held back by the bank 51 of the recess portion 48 is positioned.

As illustrated in FIG. 12, the experiment showed that, when the maximum angle θ1max at the point indicated by A was about 15°, the angle θ1 was about 5° and the angle θ2 was about 2° at the point indicated by B. As illustrated in FIG. 13, the experiment also showed that, when the maximum angle θ1max at the point indicated by A was about 50°, the angle θ1 was about 5° and the angle θ2 was about 2° at the point indicated by B. As illustrated in FIG. 14, the experiment also showed that, when the maximum angle θ1max at the point indicated by A was about 5°, the point indicated by A coincided with the point to be indicated by B, and the angles θ1 and θ2 at the point to be indicated by B were about 5° and about 2°, respectively.

The experimental results shown in FIG. 11 indicates that there is no correlation between the depth of the recess portion 48 and the control of spreading of the alignment film material 24, and only the maximum angle θ1max of the bank 51 exerts an influence on the control of spreading of the alignment film material 24. When the maximum angle θ1max is smaller than 5°, the alignment film material 24 spreads without being supported by the bank 51. On the other hand, when the maximum angle θ1max is equal to or larger than 88°, the sum of θ1max and 82 becomes equal to or larger than 90°, resulting in that the alignment film cannot be held back. Accordingly, it has been found that the bank 51 sufficiently supports the alignment film material 24 when the maximum angle θ1max is equal to or larger than 5° and smaller than 88°.

As described above, since the maximum angle θ1max formed by the tangent plane 53 of the bank 51 is appropriately set, the alignment film material 24 flowing from a side near the pixel region 31 can be held back at the bank 51 by the angle θ2 only. Consequently, the alignment film material 24, and accordingly, the alignment film 23 bulges toward the liquid crystal layer 13 near the bank 51 of the recess portion 48.

As shown in FIG. 4, the bulging portion of the alignment film 23 or the alignment film material 24 has a width of about 200 μm. The bulging portion of the alignment film 23 has a thickness a of about 10 μm or less. After curing, in the alignment film 23, the thickness a of the bulging portion becomes about 0.7 μm. On the other hand, a flat portion of the alignment film material 24 located in the pixel region 31 has a thickness b of about 3 μm. After curing, in the alignment film 23, the thickness b of the flat portion located in the pixel region 31 becomes about 0.1 μm.

The counter substrate 12 includes a glass substrate (not shown) serving as a support substrate. A plurality of color layers (not shown) constituting a color filter (not shown) and a black matrix (not shown) serving as a light-shielding film are formed on a surface of the glass substrate facing the liquid crystal layer 13. The common electrode (not shown) made of a transparent conductive film such as an ITO film is formed on a surface of the color filter. In a manner similar to the TFT substrate 11, the surface of the common electrode is covered with an alignment film.

Fabrication Method

Next, a method for fabricating the liquid crystal display device 1 will be described.

The method for fabricating the liquid crystal display device 1 includes the step of forming the TFT substrate 11, the step of forming the counter substrate 12, and the step of attaching the TFT substrate 11 and the counter substrate 12 to each other with the liquid crystal layer 13 and the sealing material 14 interposed between the substrates 11 and 12.

Specifically, the liquid crystal display device 1 is fabricated by forming the sealing material 14 in a frame shape on the TFT substrate 11 or on the counter substrate 12, dropping a liquid crystal material inside the sealing material 14, and then attaching the TFT substrate 11 and the counter substrate 12 to each other.

The step of forming the TFT substrate 11 includes the step of forming the source/gate line layer 16 and 18 on the glass substrate 21 which is a transparent support substrate, the step of forming the planarized film 43 covering the source/gate line layer 16 and 18 on the glass substrate 21, and the step of forming the alignment film 23 directly on a surface of the planarized film 43 covering the source/gate line layer 16 and 18.

In the step of forming the source/gate line layer 16 and 18, the gate lines 18, the gate insulating film 41, a silicon film (not shown), the source lines 16, the passivation film 42, the planarized film 43, and the ITO film, for example, are formed on a surface of the glass substrate 21.

A metal film such as the gate lines 18 is formed by sputtering. The semiconductor layer, the insulating film, and the channel protection film which constitute the TFTs are formed by chemical vapor deposition (CVD). These films and layer are then subjected to photolithography and wet etching or dry etching to be formed into predetermined shapes.

In the step of forming the planarized film 43, the recess portion 48 which does not penetrate the planarized film 43 is formed on a surface of the planarized film 43. As seen perpendicularly to (i.e. as seen in the direction of the normal to) the surface of the glass substrate 21, the recess portion 48 at least partially overlaps the source/gate line layer 16 and 18. The recess portion 48 has the bank 51 located in the picture-frame region 32, and the tangent plane of the bank 51 increases in inclination toward the glass substrate 21 as the tangent plane is shifted toward the bottom of the recess portion 48.

In addition, the recess portion 48 is formed to extend along the region where the sealing material 14 is formed, and positioned between the pixel region 31 and the region where the sealing material 14 is formed.

The planarized film 43 can be formed by using an organic photosensitive material such as a photo-curable acrylic resin or a non-photosensitive insulating film. When an organic photosensitive material is used, this organic material is applied to the glass substrate 21 by means of spin coating (which may be replaced by slit coating or an ink-jet method) such that the applied material has a flat surface.

Figure 7:
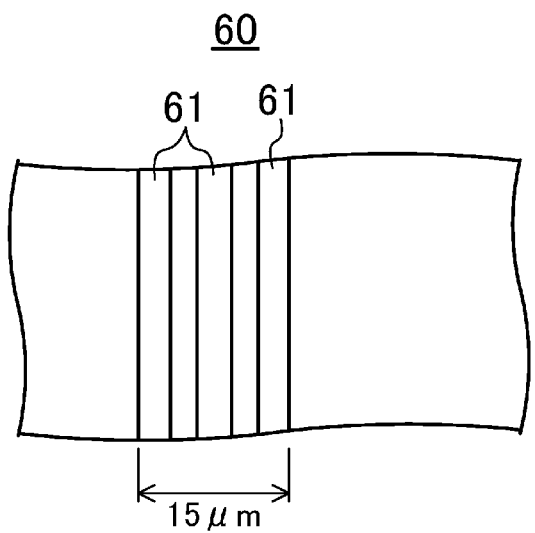
FIG. 7 is a plan view schematically showing a halftone mask for use in forming the recess portion.
Figure 8:
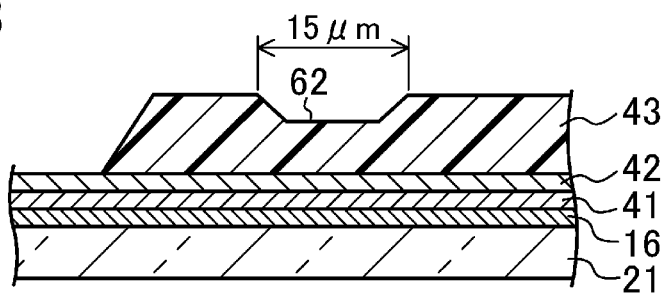
FIG. 8 is a cross-sectional view showing a planarized film having been developed after halftone exposure.
Figure 9:
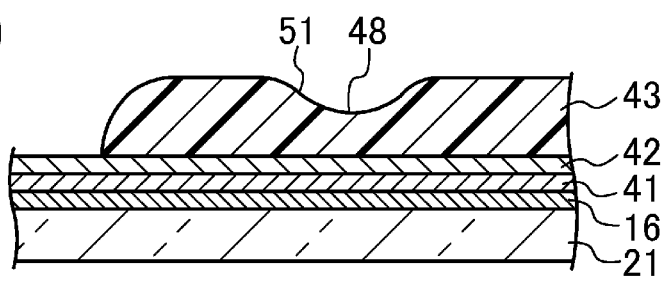
FIG. 9 is a cross-sectional view showing the planarized film having been subjected to post baking.

Subsequently, the recess portion 48 on the planarized film 43 is formed by performing halftone exposure. FIG. 7 is a plan view schematically showing a halftone mask 60 for use in forming the recess portion 48. FIG. 8 is a cross-sectional view showing the planarized film 43 having been developed after the halftone exposure. FIG. 9 is a cross-sectional view showing the planarized film 43 having been subjected to post baking.

As shown in FIG. 7, the halftone mask 60 for use in the halftone exposure has a plurality of slits 61 formed at predetermined intervals. The slits 61 each have a width of about 3 μm, and are arranged at intervals of about 3 μm. Accordingly, the region where the slits 61 are formed has a width of about 15 μm as a whole.

When a region of the planarized film 43 extending along the sealing material formation region 34 is developed after having been subjected to exposure using the halftone mask 60, a groove portion 62 having a concave surface is formed, as shown in FIG. 8. Thereafter, the planarized film 43 having the groove portion 62 formed thereon is heated through post-baking, and the concave surface on the planarized film 43 becomes gently curved. Consequently, the groove portion 62 which has been thermally deformed is transformed into the recess portion 48 having the bank 51 with the curved surface.

When the planarized film 43 is formed by using a non-photosensitive insulating film, an insulating material layer having a uniform thickness is formed on the glass substrate 21 by CVD (which may be replaced by sputtering or coating of a coating-type material), and a photoresist is then applied to the entire surface of the insulating material layer. Thereafter, a predetermined resist pattern is formed by photolithography. The insulating material layer is subjected to etching (wet etching or dry etching) to remove the resist pattern, thereby forming the recess portion 48.

Next, in the step of forming the alignment film 23, the alignment film material 24 having fluidity is allowed to spread from the pixel region toward the picture-frame region. The edge end 25 of the alignment film material 24 is supported by the bank of the recess portion 48 whereas the bottom of the recess portion 48 is left uncovered by the alignment film material 24.

Specifically, the ITO film is first formed on the planarized film 43. The resultant ITO film is patterned through photolithography and etching to form the pixel electrodes 15. Thereafter, the alignment film material 24 with fluidity such as polyimide is supplied by using an ink-jet method such that the alignment film material 24 covers the pixel electrodes 15 and other components.

The alignment film material 24 flows from the pixel region 31 to the picture-frame region 32, and the edge end 25 of the alignment film material 24, upon reaching the bank 51 of the recess portion 48, is supported by the bank 51. Consequently, as shown in FIG. 4, the alignment film material 24 is held back with its portion located near the bank 51 of the recess portion 48 bulging toward the liquid crystal layer 13. The alignment film material 24 is then baked to be formed into the alignment film 23. In this manner, the TFT substrate 11 is produced.

Advantages of First Embodiment

According to the first embodiment, the recess portion 48 for supporting the alignment film 23 (the alignment film material 24) is formed on the TFT substrate 11, and the recess portion 48 has the bank 51 having such a shape that the tangent plane 53 increases in inclination toward the glass substrate 21 as the tangent plane 53 is shifted toward the bottom of the recess portion 48. Accordingly, the bank 51 can support the edge end 25 of the alignment film 23 (the alignment film material 24) even if the alignment film material 24 has a relatively low viscosity.

A redundant portion of the alignment film material 24 is held back at the bank 51 of the recess portion 48 and caused to bulge toward the liquid crystal layer 13. Consequently, no structure such as a groove structure for receiving and stopping the alignment film material 24 needs to be formed at a side closer to the sealing material formation region 34 relative to the bank 51 of the recess portion 48. As a result, spreading of the alignment film material 24 can be appropriately reduced and the alignment film material 24 can be prevented from overlapping the sealing material 14 whereas the picture-frame region 32 of the liquid crystal display device 1 can be significantly narrowed.

In addition, the structure in which the maximum angle θ1max formed by the tangent plane 53 of the bank 51 with the glass substrate 21 is set equal to or larger than 5° and smaller than 88° further ensures that the alignment film material 24 is supported by the bank 51.

Furthermore, the structure in which the recess portion 48 overlaps the wiring layer such as the source lines 16 with the planarized film 43 interposed between recess portion 48 and the wiring layer enables the planarized film 43 to protect the wiring layer from an etchant, and at the same time, enables the recess portion 48 to be formed to extend continuously regardless of the layout of the wiring layer. Accordingly, the recess portion 48 can be formed along the sealing material formation region 34 and into a frame shape surrounding the pixel region 31, resulting in that the spreading of the alignment film material 24 can be reduced more appropriately.

Meanwhile, a conventional structure in which a groove structure formed on a substrate receives and stops the alignment film material has disadvantages. Specifically, when fabricating a liquid crystal display device by dropping a liquid crystal material on the substrate, it is difficult to determine an appropriate volume of the liquid crystal material to be dropped, taking into account an unoccupied space of the capacity of the groove structure. This is because it cannot be known how much of the capacity of the groove structure is occupied by the alignment film material. If an insufficient amount of the liquid crystal material is used, the resultant liquid crystal layer may adversely contain air bubbles.

On the other hand, as shown in FIG. 4, in this embodiment, the alignment film material 24 is not received in the recess portion 48, but is held back by the bank 51 of the recess portion 48. Accordingly, the volume of the liquid crystal material to be dropped can be kept substantially constant. Therefore, an appropriate volume of the liquid crystal material can be supplied onto the surface of the glass substrate 21, thereby reducing formation of air bubbles in the liquid crystal layer 13.

Furthermore, since the planarized film 43 is made of the photo-curable acrylic resin, the recess portion 48 and the bank 51 can be easily formed into appropriate shapes by the half-tone exposure in a highly controllable manner.

Other Embodiments

In the first embodiment, the recess portion 48 extends along the sealing material formation region 34 and has a frame shape continuously surrounding the pixel region 31. The present disclosure, however, is not limited to the first embodiment. The recess portion 48 may have a shape having at least one break. For example, depending on a pattern of the source/gate lines of the TFT substrate 11, the recess portion 48 may have a break in a region where spreading of the alignment film 23 causes no problem.

Figure 15:
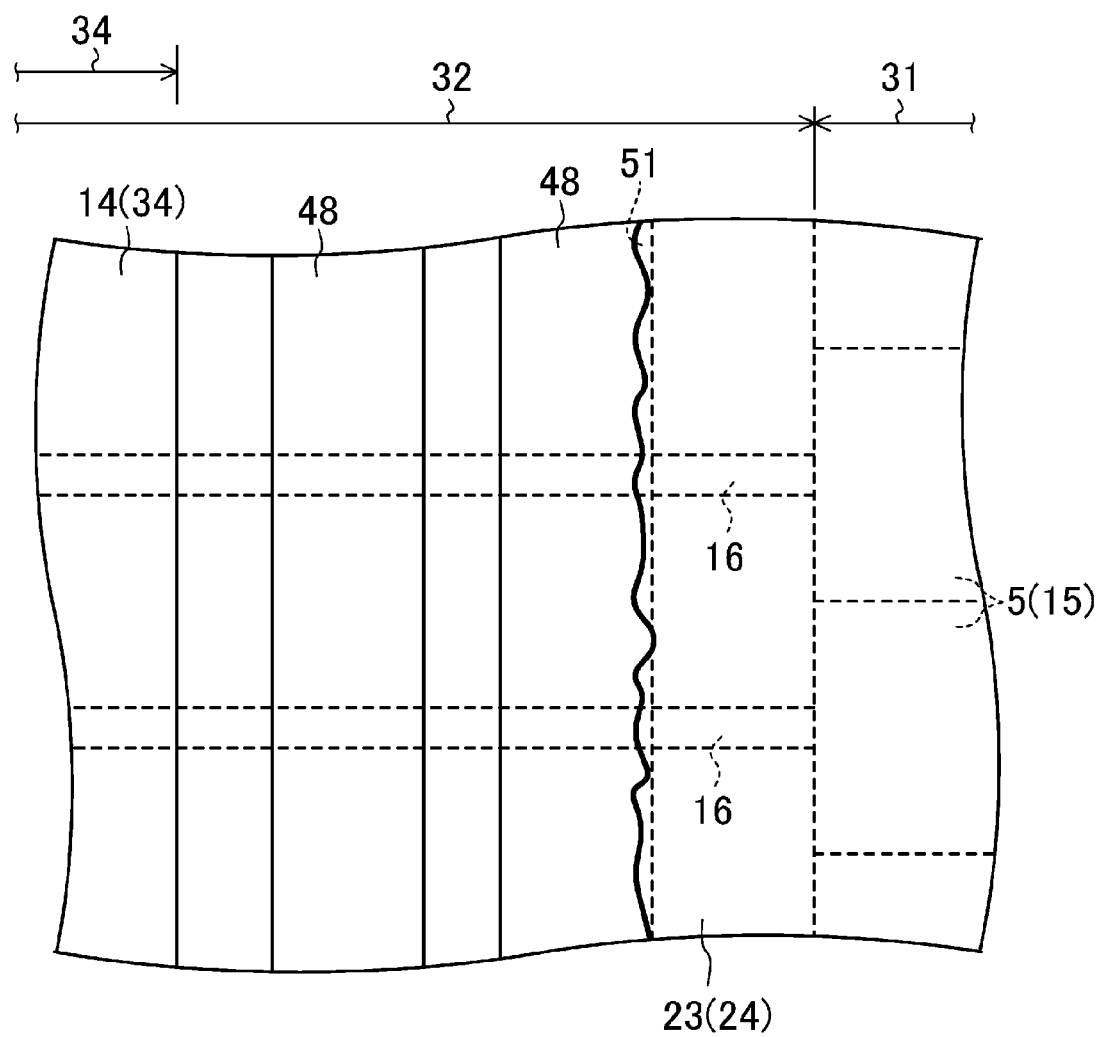
FIG. 15 is an enlarged plan view showing a portion of a TFT substrate according to another embodiment.
Figure 16:
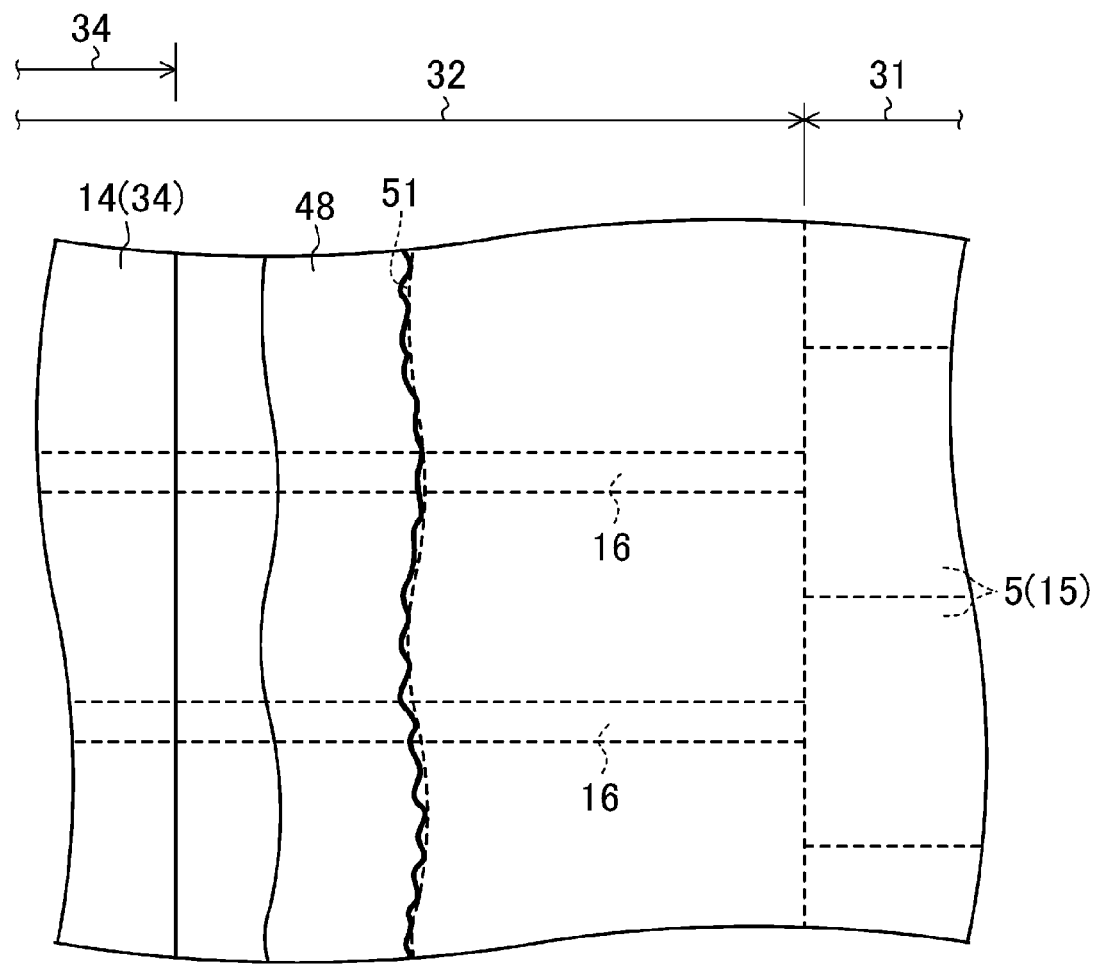
FIG. 16 is an enlarged plan view showing a portion of a TFT substrate according to another embodiment.

FIGS. 15 and 16 are enlarged plan views showing portions of TFT substrates according to other embodiments. The first embodiment has exemplified the single recess portion 48 formed along the sealing material formation region 34. The present disclosure, however, is not limited to the first embodiment. As shown in FIG. 15, two or more recess portions 48 may be formed along the sealing material formation region 34.

In this structure, even if the alignment film material 24 goes beyond the recess portion 48 located near the pixel region 31 and spreads outward (leftward in FIG. 15), the bank 51 of the other recess portion 48 located outward relative to the recess portion 48 near the pixel region 31 can reduce spreading of the alignment film material 24.

The first embodiment has exemplified the recess portion 48 extending linearly. The present disclosure, however, is not limited to the first embodiment. As shown in FIG. 16, the recess portion 48 may meanderingly extend along the sealing material formation region 34. This structure also can sufficiently reduce spreading of the alignment film material 24.

Figure 17:
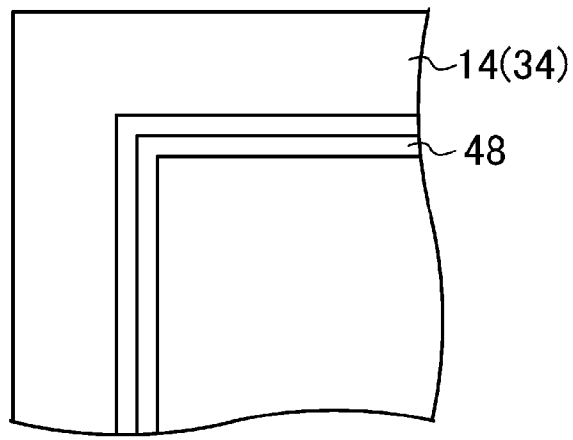
FIG. 17 is an enlarged plan view showing a corner portion of a TFT substrate according to another embodiment.
Figure 18:
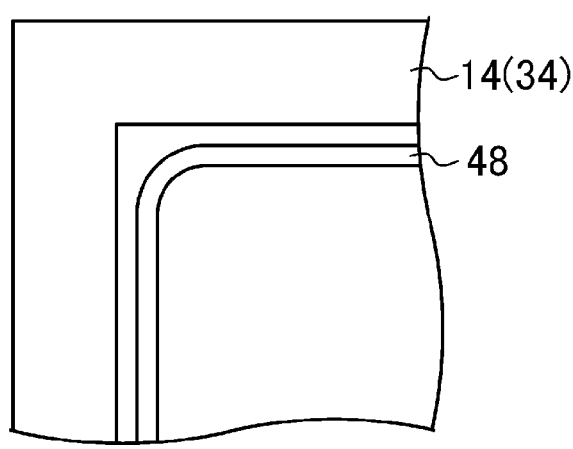
FIG. 18 is an enlarged plan view showing a corner portion of a TFT substrate according to another embodiment.
Figure 19:
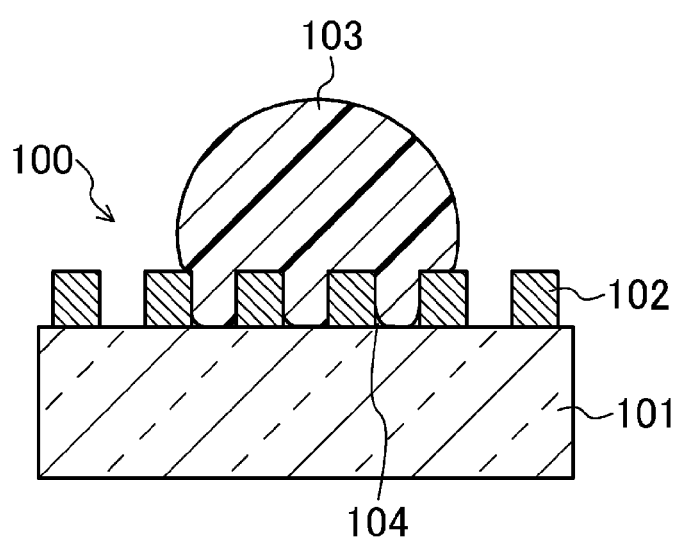
FIG. 19 is a cross-sectional view showing the principle by which a conventional structure controls spreading by wetting of an alignment film material.

FIGS. 17 and 18 are enlarged plan views showing corner portions of TFT substrates according to other embodiments. In a corner region of the sealing material formation region 34, the recess portion 48 may have a substantially right-angled corner as shown in FIG. 17 or an arc-shaped corner as shown in FIG. 18.

INDUSTRIAL APPLICABILITY

As described above, the present disclosure is useful for a liquid crystal display device and a method for fabricating the same, in particular, for controlling a region to which an alignment film is applied.

DESCRIPTION OF REFERENCE CHARACTERS

1 Liquid crystal display device
11 TFT substrate (First substrate)
12 Counter substrate (Second substrate)
13 Liquid crystal layer
14 Sealing material
16 Source lines (Wiring layer)
18 Gate lines (Wiring layer)
21 Glass substrate (Support substrate)
23 Alignment film
24 Alignment film material
25 Edge end
31 Pixel region
32 Picture-frame region
34 Sealing material formation region
43 Planarized film (Insulating film)
48 Recess portion
51 Bank

The invention claimed is:

1. A liquid crystal display device, comprising:
a first substrate;
a second substrate provided opposite to the first substrate;
a liquid crystal layer interposed between the first and second substrates; and
a sealing material interposed between the first and second substrates and surrounding the liquid crystal layer to enclose the liquid crystal layer,
wherein
each of the first and second substrates includes a pixel region serving as a display region and a picture-frame region serving as a non-display region surrounding an outer periphery of the pixel region and including a region where the sealing material is formed, on each of a surface of the first substrate facing the liquid crystal layer and a surface of the second substrate facing the liquid crystal layer, an alignment film formed by curing an alignment film material having fluidity spreads from the pixel region toward the picture-frame region, the first substrate includes a support substrate, a wiring layer formed on the support substrate, and an insulating film covering the wiring layer on the support substrate and having a surface located opposite to the support substrate and partially and directly covered with the alignment film, a recess portion which does not penetrate the insulating film is formed on a surface of the insulating film, as seen perpendicularly to a surface of the support substrate, the recess portion at least partially overlaps the wiring layer, a bank of the recess portion is located in the picture-frame region and has such a shape that a tangent plane of the bank increases in inclination toward the support substrate as the tangent plane is shifted toward a bottom of the recess portion, and an edge end of the alignment film is supported by the bank of the recess portion whereas the bottom of the recess portion supporting the edge end of the alignment film is uncovered by the alignment film.

2. The liquid crystal display device of claim 1, wherein the recess portion extends along the region where the sealing material is formed.

3. The liquid crystal display device of claim 1, wherein the recess portion is positioned between the pixel region and the region where the sealing material is formed.

4. The liquid crystal display device of claim 1, wherein a portion of the alignment film located near the bank of the recess portion bulges toward the liquid crystal layer.

5. The liquid crystal display device of claim 1, wherein the insulating film is made of a photo-curable resin.

6. A method for fabricating a liquid crystal display device including a first substrate and a second substrate provided opposite to each other, the first and second substrates each having a pixel region serving as a display region and a picture-frame region serving as a non-display region surrounding an outer periphery of the pixel region and including a region where a sealing material is formed, the method comprising the steps of:
forming the first substrate;
forming the second substrate; and
attaching the first and second substrates to each other with a liquid crystal layer and the sealing material interposed between the first and second substrates, wherein the forming the first substrate includes the step of forming a wiring layer on a support substrate, the step of forming an insulating film covering the wiring layer on the support substrate, and the step of forming an alignment film directly on a surface of the insulating film covering the wiring layer, in the step of forming the insulting film, a recess portion which does not penetrate the insulating film is formed on a surface of the insulating film, the recess portion having such a shape that, as seen perpendicularly to a surface of the support substrate, the recess portion at least partially overlaps the wiring layer, a bank of the recess portion is located in the picture-frame region, and a tangent plane of the bank increases in inclination toward the support substrate as the tangent plane is shifted toward a bottom of the recess portion, and in the step of forming the alignment film, an alignment film material having fluidity is allowed to spread from the pixel region toward the picture-frame region, an edge end of the alignment film material is supported by the bank of the recess portion whereas the bottom of the recess portion supporting the edge end of the alignment film material is left uncovered by the alignment film material.

7. The method of claim 6, wherein
in the step of forming the insulating film, the recess portion is formed to extend along the region where the sealing material is formed.

8. The method of claim 6, wherein
in the step of forming the insulating film, the recess portion is positioned between the pixel region and the region where the sealing material is formed.

9. The method of claim 6, wherein
in the step of forming the alignment film, a portion of the alignment film located near the bank of the recess portion is caused to bulge toward the liquid crystal layer.

10. The method of claim 6, wherein
in the step of forming the insulating film, a photo-curable resin is used to form the insulating film.

* * * * *